United States Patent [19]

Tanaka

[11] Patent Number: 5,639,994

[45] Date of Patent: Jun. 17, 1997

[54] FLEXIBLE PRINTED CIRCUIT

[75] Inventor: Kazuhisa Tanaka, Omiya, Japan

[73] Assignee: Fuji Photo Optical Co., Ltd., Japan

[21] Appl. No.: 562,157

[22] Filed: Nov. 22, 1995

[30] Foreign Application Priority Data

Nov. 24, 1994 [JP] Japan ................... 6-289569

[51] Int. Cl.⁶ .................................. H05K 1/11
[52] U.S. Cl. ............................ 174/254; 174/250
[58] Field of Search ............................ 174/254, 250, 174/255; 361/749; 439/67, 77

[56] References Cited

U.S. PATENT DOCUMENTS

| | | | |
|---|---|---|---|
| 3,633,189 | 1/1972 | Billawala | 340/174.1 F |
| 4,353,372 | 10/1982 | Ayer | 128/640 |
| 5,047,895 | 9/1991 | Sasaki | 361/398 |
| 5,296,831 | 3/1994 | Suzuki | 336/200 |
| 5,337,202 | 8/1994 | Jabbarai et al. | 360/97.01 |

FOREIGN PATENT DOCUMENTS 57-34388  2/1982  Japan.

*Primary Examiner*—Laura Thomas
*Attorney, Agent, or Firm*—Sixbey, Friedman, Leedom & Ferguson, P.C.; David S. Safran

[57] ABSTRACT

A bypass piece is formed at a forward end of a extension part. Three bypass Cu wiring patterns, which cannot be formed at a extension part, are formed at the bypass piece. The bypass piece is bent from the forward end of the extension part towards the main body so as to overlap the extension part. Connecting portions of the bypass Cu wiring patterns of the bypass piece are soldered to end portions of wiring patterns of the main body.

5 Claims, 4 Drawing Sheets

FLEXIBLE PRINTED CIRCUIT

BACKGROUND OF THE INVENTION

1. Field of the Invention

The present invention relates to a flexible printed circuit, and more particularly to a flexible printed circuit applied to an optical equipment such as a camera, a VTR integrated with a camera, an electronic still camera, and the like.

2. Description of the Related Art

Electronic optical equipments such as a camera, a VTR integrated with a camera, and the like have become lightweight and compact because their electrical circuits have been highly integrated. A flexible printed circuit which is connected to electrical parts such as an IC, etc. have also become smaller.

A pull-out portion extending from a main body is formed in the above-mentioned flexible printed circuit, and a wiring pattern from a main body is formed at the pull-out portion, and furthermore, a terminal of the wiring pattern, which is connected to the above-mentioned electrical parts, is formed at a forward end of the pull-out portion. The pull-out portion is arranged in a gap between mechanical parts of the camera, and is connected to a predetermined electrical circuit when the flexible printed circuit is incorporated into the camera body.

However, as the camera has become more compact, the gap between the mechanical parts of the camera becomes narrower. As a result, a width of the pull-out portion of the flexible printed circuit is also regulated, so there is a disadvantage in that all of the wiring patterns, which are required to be formed at a pull-out portion, cannot be formed at the pull-out portion.

In the above-mentioned case, it is possible that the flexible printed circuit is multilayered and fined, however, there is a problem in that the cost is too high.

Therefore, a flexible printed circuit in FIGS. 4 and 5 is conventionally used so as to eliminate the above-mentioned disadvantages.

In the flexible printed circuit in FIG. 4, terminals 4, 4 of the pull-out portion 1 are connected to connecting terminals of the main body 5 by jumper wires 3, 3 instead of two wiring patterns which cannot be formed at a pull-out portion 1 among wiring patterns which should be formed at the pull-out portion 1.

In a flexible printed circuit in FIG. 5, the two wiring patterns 8, 8 which cannot be formed at the pull-out portion 7, are formed at a pull-out portion 7A for bypass, and the pull-out portion 7A is bent at bent portions 9, 9 which are shown with dot lines so as to overlap the pull-out portion 7.

However, if the number of the jumper wires 3 is increased in the flexible printed circuit in FIG. 4, a space for arranging the jumper wires 3 is increased. As a result, there is a disadvantage in that the pull-out portion is arranged in a small space.

Furthermore, in the flexible printed circuit in FIG. 5, the wiring pattern should be forme don the side which is a main portion of the flexible printed circuit. As a result, a path for pulling the wire pattern becomes complicated, and the pull-out portion 7A for bypass is restricted by a position where the pull-out portion 7 is formed because the pull-out portion 7A has to be formed at the corner portion of the flexible printed circuit.

The present invention has been developed under the above-described circumstances, and has as its aim the provision of the flexible printed circuit in which a wiring pattern which cannot be formed at a pull-out portion can be formed in a small space without being restricted by a position where the pull-out portion is formed.

SUMMARY OF THE INVENTION

In the flexible printed circuit of the present invention, in which a plurality of wiring patterns are formed at a pull-out portion extending from a main body and a terminal of the wiring patterns is formed at a forward end of the pull-out portion: a bypass piece is formed at a forward end of the pull-out portion and a bypass wiring pattern is formed at the bypass piece; a terminal is formed at a forward end of the pull-out portion in one end portion of the bypass wiring pattern; and a connecting portion spliced to an end portion of a wiring pattern of the main body, which corresponds to the bypass wiring pattern, by bending the bypass piece from the forward end towards the main body in the other end portion of the bypass wiring pattern.

According to the present invention, a bypass piece is formed at a forward end of the pull-out portion, and a bypass wiring pattern, which cannot be formed at the pull-out portion and of which a terminal is formed at a forward end of the pull-out portion, is formed at the bypass piece. Then, the bypass piece is bent from the forward end of the bypass piece towards the main body of the flexible printed circuit. The other end portion of the bypass wiring pattern of the bypass piece is spliced to the end portion of the wiring pattern which corresponds to the bypass wiring pattern.

BRIEF DESCRIPTION OF THE DRAWINGS

The exact nature of this invention, as well as other objects and advantages thereof, will be readily apparent from consideration of the following specification relating to the accompanying drawings, in which like reference characters designate the same or similar parts throughout the figures and wherein.

DESCRIPTION OF THE PREFERRED EMBODIMENT

Detailed description will hereunder be given of the preferred embodiment of a camera according to the present invention with reference to the accompanying drawings.

Figure 1:
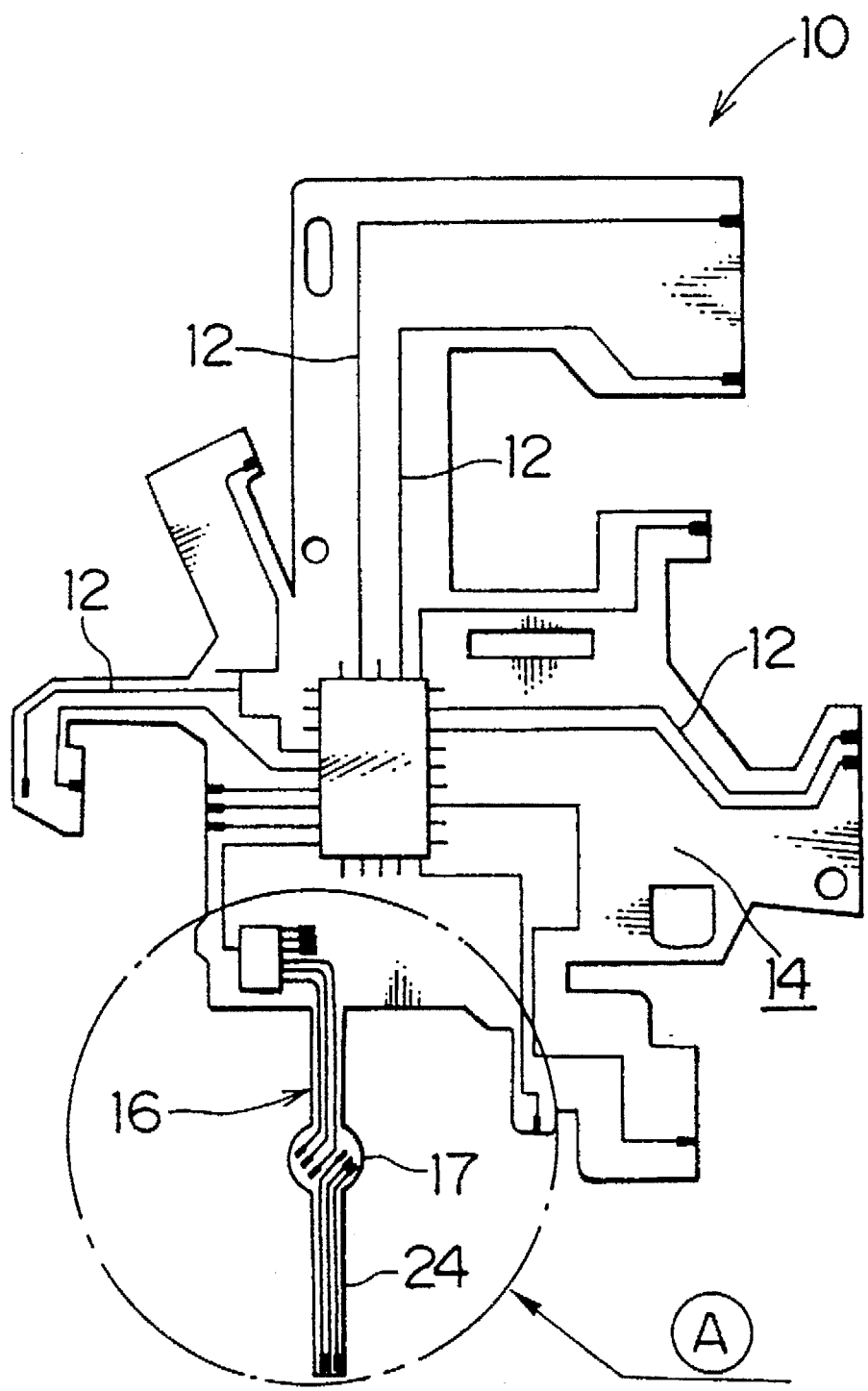
FIG. 1 is a view illustrating an embodiment of a flexible printed circuit according to the present invention.

FIG. 1 is a view illustrating a view illustrating an embodiment of a flexible printed circuit of the present invention which is applied to an electronic still camera. The flexible printed circuit 10 of FIG. 1 is a one-side flexible printed circuit, and is constructed in such a manner that an insulating cover layer is put on a base plate, on which Cu wiring patterns 12, 12 . . . are formed.

Figure 2:
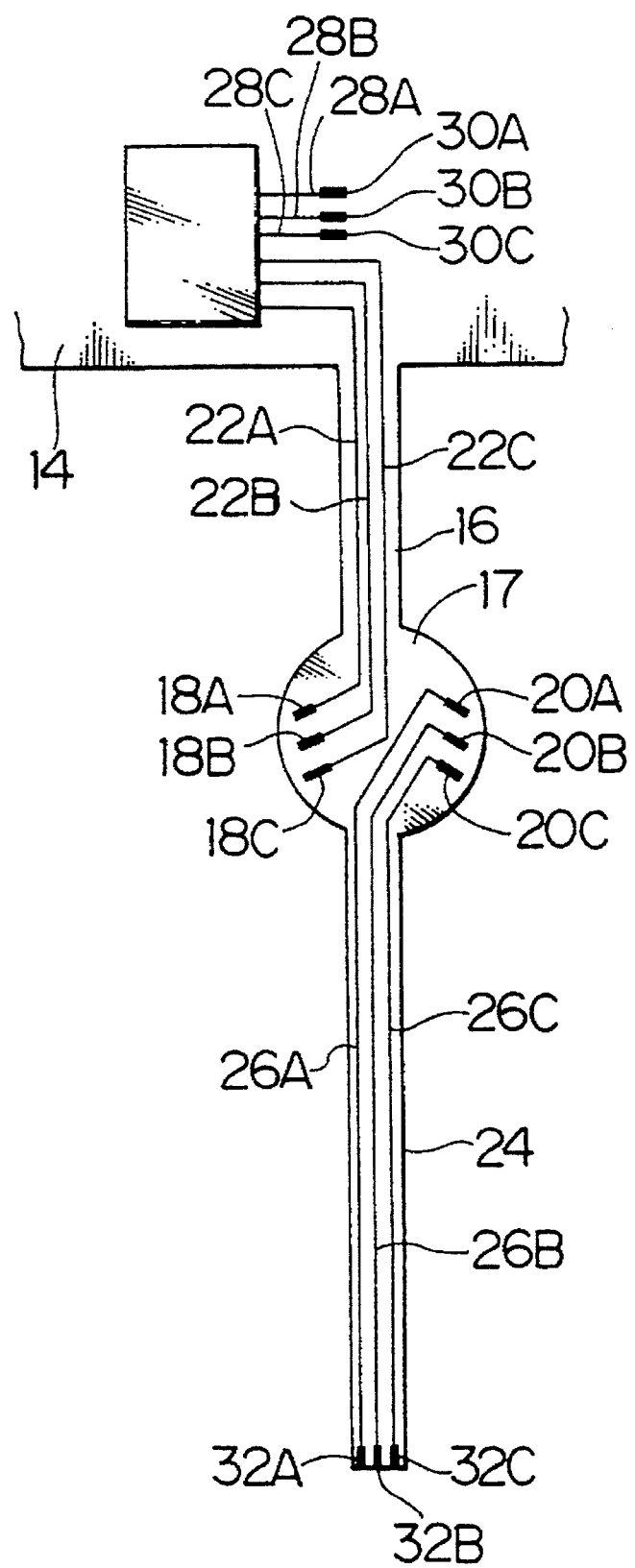
FIG. 2 is an enlarged view illustrating a pull-out portion in FIG. 1.

As shown in FIG. 2, a extension part 16, which extends from a main body 14, is formed at the main body 14 of the flexible printed circuit 10. Three terminals 18A, 18B and 18C are formed on aa left side of a circular forward end 17 of the extension part 16, and three terminals 20A, 20B and 20C are formed on a right side thereof. Electrical parts which are not shown in the drawing are connected to these terminals.

The width of the extension part 16 is very small so as to be arranged in a small gap between mechanical parts of the camera. As a result, only three Cu wiring patterns 22A, 22B and 22C can be formed at the extension part 16. The above-mentioned terminals 18A, 18B and 18C on the left side are formed at forward ends of the three Cu wiring patterns 22A, 22B and 22C.

A belt-shaped bypass 24A is formed at a forward end 17 of the extension part 16 so as to be integrated with the extension part 16. The width of the bypass piece 24 is slightly smaller than the extension part 16. The bypass piece 24 is constructed in such a manner that a cover layer is put on a base plate just as in the flexible printed circuit 10. Three bypass Cu wiring patterns 26A, 26B and 26C, which cannot be formed at the extension part 16, are formed on the base plate.

The bypass Cu wiring patterns 26A, 26B and 26C are formed along the bypass piece 24, and the above-mentioned terminals 20A, 20B and 20C on the right side are formed at a top end portion of the bypass Cu wiring patterns 26A, 26B and 26C as shown in the drawing. Furthermore, connecting portions 32A, 32B and 32C are formed at a bottom end portion of the bypass Cu wiring patterns 26A, 26B and 26C. The connecting portions 32A, 32B and 32C are spliced to end portions 30A, 30B and 30C of Cu wiring patterns 28A, 28B and 28C of a main body 14, which correspond to the bypass Cu patterns 26A, 26B and 26C when the bypass piece 24 is bent from the forward end 17 of the extension part 16 towards the main body 14 (see FIG. 3).

Figure 3:
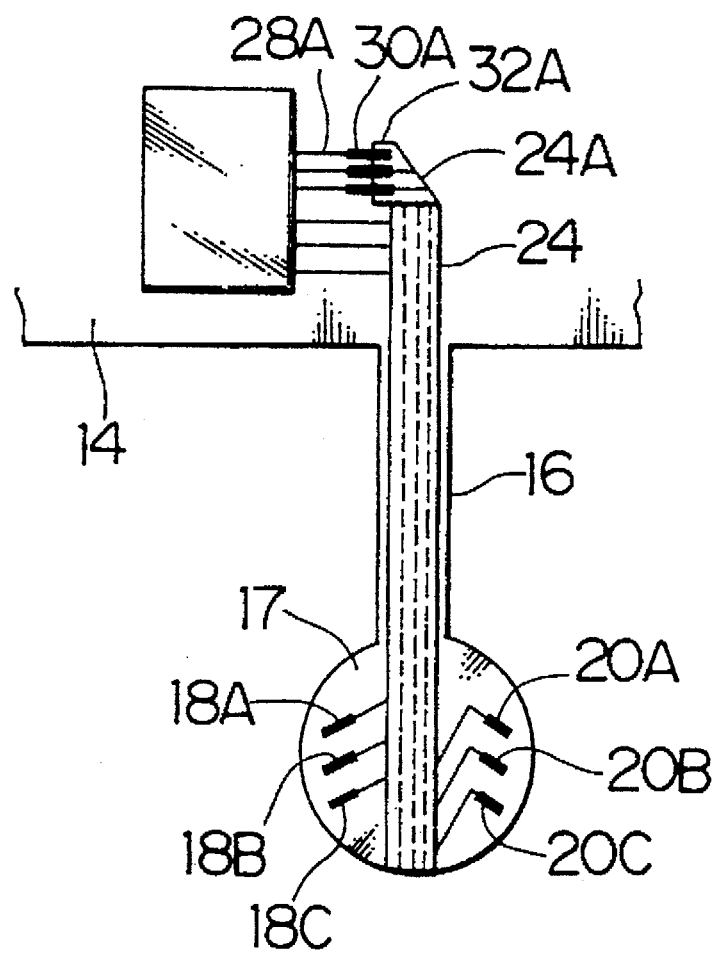
FIG. 3 is an explanatory view illustrating a mode of using the pull-out portion in FIG. 1.
Figure 4:
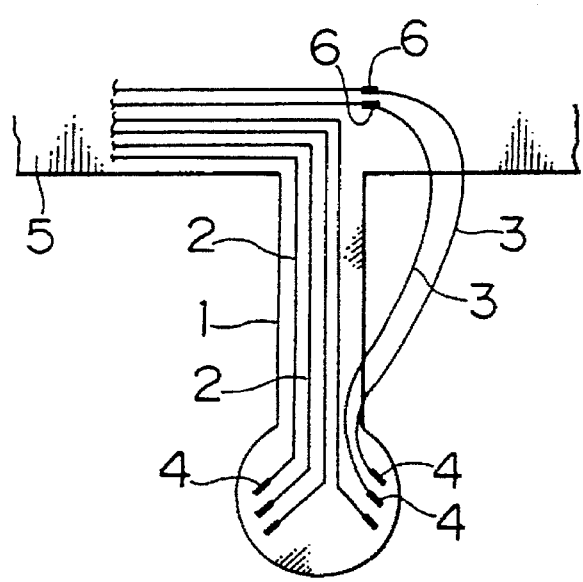
FIG. 4 is an enlarged view illustrating a pull-out portion of the conventional flexible printed circuit.
Figure 5:
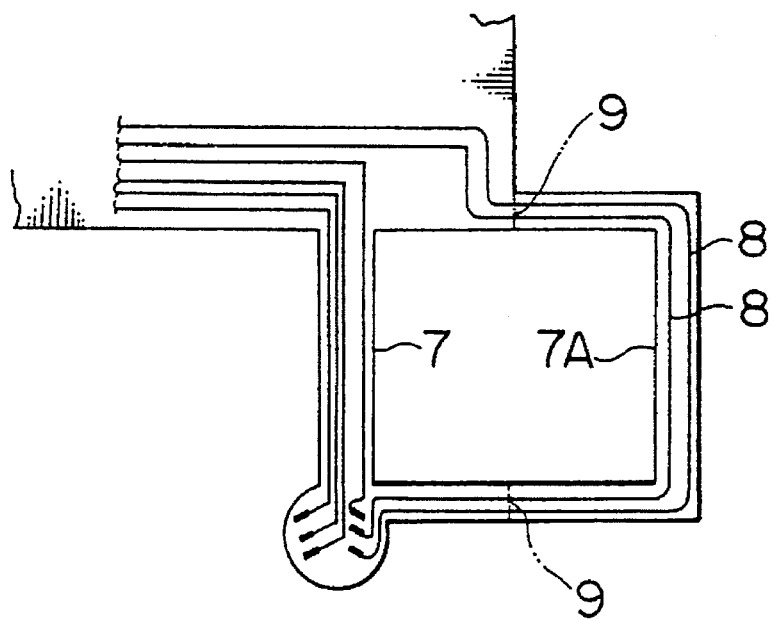
FIG. 5 is an enlarged view illustrating a pull-out portion of the conventional flexible printed circuit.

According to the flexible printed circuit 10 which is constructed in the above-mentioned manner, the bypass 24 is bent from the forward end portion 17 of the extension part 16 towards the main body 14 of the flexible printed circuit 10 so as to overlap the extension part 16 as shown in FIG. 3. Then, a forward end portion 24A of the bypass piece 24 is turned up towards the outside, and connecting portions 32A, 32B and 32C of the bypass Cu wiring patterns 26A, 26B and 26C of the bypass piece 24 are soldered to the end portions 30A, 30B and 30C of the Cu wiring patterns 28A, 28B and 28C of the main body 14.

Accordingly, in this embodiment, the Cu wiring patterns, which cannot be formed at the pull-out portion 16, are formed at the bypass piece 24 as the bypass Cu wiring patterns 26A, 26B and 26C. The bypass piece 24 is bent so that the bypass Cu wiring patterns 26A, 26B and 26C are spliced to the Cu wiring patterns 28A, 28B and 28C of the main body 14. As a result, the wiring patterns, which cannot be formed at the extension part 16, can be formed in a small space without being regulated by a position where the extension part 16.

In this embodiment, the explanation was given of the flexible printed circuit which is applied to the electronic camera, but the present invention is not limited to this. The present invention can be applied to electronic optical equipments such as the VTR integrated with a camera, the electronic still camera, and the like.

Moreover, the explanation was given of the one-side flexible printed circuit in this embodiment, but the present invention is not limited to this. If the flexible printed circuit is multilayered or fined, it is advantageous when the number of wiring patterns is desired to be increased.

As has been described above, according to the flexible printed circuit of the present invention, the bypass piece is formed at the forward end of the extension part, and the bypass wiring patterns are formed at the bypass piece. The bypass piece is bent from the forward end of the extension part towards the main body, so that the other end portions of the bypass wiring patterns are spliced to the end portion of the wiring pattern of the main body. As a result, the wiring pattern, which cannot be formed at the pull-our portion, can be formed in a small space without being regulated by a position where the extension part is formed.

It should be understood, however, that there is no intention to limit the invention to the specific forms disclosed, but on the contrary, the invention is to cover all modifications, alternate constructions and equivalents falling within the spirit and scope of the invention as expressed in the appended claims.

I claim:

1. A flexible printed circuit used for an optical instrument such as a camera, VTR integrated with a camera, an electronic still camera and the like, the flexible printed circuit comprising:

a main body including a main wiring pattern;

at least one extension part extended from the main body, a first wiring pattern being printed on the extension part; and at least one bypass part extended from an edge of the extension part, a second wiring pattern being printed on the bypass part;

wherein the second wiring pattern on the bypass part is electrically disconnected and physically separated from the main wiring pattern on the main body and from the first wiring pattern on the extension part in an unfolded condition of the flexible printed circuit.

2. A flexible printed circuit used for an optical instrument such as a camera, VTR integrated with a camera, an electronic still camera and the like, according to claim 1, wherein the first wiring pattern extends from the main wiring pattern and includes a plurality of terminals, and wherein the second wiring pattern includes a plurality of terminals.

3. A flexible printed circuit used for an optical instrument such as a camera, VTR integrated with a camera, an electronic still camera and the like, according to claim 2, wherein a central part is formed between the extension part and the bypass part, wherein the plurality of terminals of the first wiring pattern are arranged in the central part, and wherein the plurality of terminals of the second wiring pattern are arranged in the central part and in an end of the bypass part.

4. A flexible printed circuit used for an optical instrument such as a camera, VTR integrated with a camera, an electronic still camera and the like, according to claim 3, wherein the bypass part is folded at the central part in such a manner as to overlap the extension part and in such a manner as to connect the plurality of terminals of the end of the bypass part with the main wiring pattern.

5. A flexible primed circuit used for an optical instrument such as a camera, VTR integrated with a camera, an electronic still camera and the like, according to claim 1, wherein the second wiring pattern is electrically connectable with the main wiring pattern by folding of the bypass part onto the extension part.

* * * * *